United States Patent
Lin et al.

(10) Patent No.: US 9,524,869 B2
(45) Date of Patent: Dec. 20, 2016

(54) NITRIDE-BASED SEMICONDUCTOR LIGHT-EMITTING DEVICE

(71) Applicant: EPISTAR CORPORATION, Hsinchu (TW)

(72) Inventors: Wen Hsiang Lin, Hsinchu (TW); Chang-Hua Hsieh, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 14/154,149

(22) Filed: Jan. 13, 2014

(65) Prior Publication Data

US 2014/0124734 A1  May 8, 2014

Related U.S. Application Data

(60) Continuation-in-part of application No. 14/029,297, filed on Sep. 17, 2013, which is a continuation-in-part (Continued)

(30) Foreign Application Priority Data

Mar. 11, 2004 (TW) .............................. 93106415 A

(51) Int. Cl.
*H01L 29/06* (2006.01)
*H01L 21/02* (2006.01)
(Continued)

(52) U.S. Cl.
CPC ....... *H01L 21/0243* (2013.01); *H01L 21/0237* (2013.01); *H01L 21/0242* (2013.01); *H01L 21/0254* (2013.01); *H01L 21/0262* (2013.01); *H01L 21/02458* (2013.01); *H01L 33/007* (2013.01); *H01L 33/12* (2013.01)

(58) Field of Classification Search
None
See application file for complete search history.

(56) References Cited

U.S. PATENT DOCUMENTS

| 1 A | 7/1836 | Ruggles |
|---|---|---|
| 5,122,845 A | 6/1992 | Manabe et al. |

(Continued)

FOREIGN PATENT DOCUMENTS

| EP | 1111663 | 6/2001 |
|---|---|---|
| JP | 53053991 A | 5/1978 |

(Continued)

OTHER PUBLICATIONS

English translation. WO 2013015035 A1 17 pages. Downloaded Nov. 3, 2015.*

*Primary Examiner* — David E Graybill
(74) *Attorney, Agent, or Firm* — Muncy, Geissler, Olds & Lowe, P.C.

(57) ABSTRACT

A nitride-based semiconductor light-emitting device includes a light-emitting stack comprising a first semiconductor structure having a first conductivity, a second semiconductor structure having a second conductivity, and an active region interposed the first semiconductor structure and the second semiconductor structure; a semiconductor buffer structure formed under the first semiconductor structure; and an un-doped AlGaN layer formed between the first semiconductor structure and the semiconductor buffer structure.

17 Claims, 17 Drawing Sheets

Related U.S. Application Data of application No. 13/776,312, filed on Feb. 25, 2013, now Pat. No. 8,562,738, which is a continuation-in-part of application No. 13/046,490, filed on Mar. 11, 2011, now Pat. No. 8,536,565, which is a division of application No. 12/270,828, filed on Nov. 13, 2008, now Pat. No. 7,928,424, which is a continuation-in-part of application No. 10/711,567, filed on Sep. 24, 2004, now Pat. No. 7,497,905.

(51) Int. Cl.
*H01L 33/00* (2010.01)
*H01L 33/12* (2010.01)

(56) References Cited

U.S. PATENT DOCUMENTS

| | | | |
|---|---|---|---|
| 5,132,750 | A | 7/1992 | Kato et al. |
| 5,290,393 | A | 3/1994 | Nakamura |
| 5,686,738 | A | 11/1997 | Moustakas |
| 5,912,476 | A | 6/1999 | Watanabe et al. |
| 5,923,950 | A | 7/1999 | Ishibashi et al. |
| 5,990,495 | A | 11/1999 | Ohba |
| 5,990,496 | A * | 11/1999 | Kunisato ............... H01L 33/007 257/103 |
| 6,048,397 | A | 4/2000 | Endo et al. |
| 6,115,399 | A | 9/2000 | Shakuda |
| 6,147,364 | A | 11/2000 | Itaya et al. |
| 6,447,938 | B1 | 9/2002 | Bianchi |
| 6,462,354 | B1 * | 10/2002 | Okuyama ............... H01L 33/32 257/103 |
| 6,577,662 | B1 * | 6/2003 | Asano .................... B82Y 20/00 372/46.01 |
| 6,589,447 | B1 | 7/2003 | Ishizaki et al. |
| 6,603,147 | B1 * | 8/2003 | Hashimoto ............. H01L 33/32 257/103 |
| 6,844,246 | B2 | 1/2005 | Nagai et al. |
| 7,390,596 | B2 | 6/2008 | Ishibashi et al. |
| 7,497,905 | B2 | 3/2009 | Ou et al. |
| 7,902,561 | B2 | 3/2011 | Lee |
| RE43,725 | E | 10/2012 | Emerson et al. |
| 8,420,425 | B2 | 4/2013 | Okuno et al. |
| 8,451,877 | B1 | 5/2013 | Crawford et al. |
| 9,123,851 | B2 * | 9/2015 | Goda ...................... H01L 33/06 |
| 2001/0002048 | A1 | 5/2001 | Koike et al. |
| 2001/0032984 | A1 | 10/2001 | Uchida |
| 2002/0094002 | A1 * | 7/2002 | Amano et al. ................. 372/45 |
| 2002/0096692 | A1 * | 7/2002 | Nakamura ........ H01L 21/02378 257/194 |
| 2002/0158264 | A1 | 10/2002 | Nakamura et al. |
| 2002/0179929 | A1 | 12/2002 | Takahashi et al. |
| 2003/0013223 | A1 | 1/2003 | Ramdani et al. |
| 2003/0045103 | A1 * | 3/2003 | Suzuki .................... C30B 25/02 438/689 |
| 2003/0057434 | A1 | 3/2003 | Hata et al. |
| 2003/0062529 | A1 | 4/2003 | Kato et al. |
| 2003/0070607 | A1 | 4/2003 | Koike et al. |
| 2003/0092230 | A1 | 5/2003 | Koike et al. |
| 2003/0092263 | A1 | 5/2003 | Koike et al. |
| 2003/0119239 | A1 | 6/2003 | Koike et al. |
| 2003/0122478 | A1 | 7/2003 | Suehiro et al. |
| 2003/0134446 | A1 | 7/2003 | Koike et al. |
| 2003/0155575 | A1 | 8/2003 | Shibata et al. |
| 2003/0162340 | A1 | 8/2003 | Tezen |
| 2003/0183837 | A1 | 10/2003 | Kushibe et al. |
| 2004/0021401 | A1 | 2/2004 | Ando |
| 2004/0048448 | A1 | 3/2004 | Koike et al. |
| 2004/0056259 | A1 * | 3/2004 | Goto ....................... B82Y 20/00 257/79 |
| 2004/0087115 | A1 | 5/2004 | Nagai et al. |
| 2004/0161006 | A1 | 8/2004 | Chang et al. |
| 2004/0161009 | A1 | 8/2004 | Edamura et al. |
| 2004/0206949 | A1 | 10/2004 | Bour et al. |
| 2004/0261693 | A1 | 12/2004 | Lai et al. |
| 2005/0089074 | A1 | 4/2005 | Koelle et al. |
| 2005/0221520 | A1 | 10/2005 | Ou et al. |
| 2005/0224781 | A1 * | 10/2005 | Kneissl ................... B82Y 20/00 257/14 |
| 2009/0127581 | A1 | 5/2009 | Ou et al. |
| 2010/0142577 | A1 * | 6/2010 | Tsuda ..................... B82Y 20/00 372/45.01 |
| 2011/0156001 | A1 | 6/2011 | Ou et al. |
| 2014/0124734 | A1 * | 5/2014 | Lin ........................ H01L 21/0237 257/13 |
| 2014/0166980 | A1 * | 6/2014 | Goda ...................... H01L 33/06 257/13 |
| 2014/0231840 | A1 * | 8/2014 | Fudeta .................... H01L 33/12 257/97 |
| 2014/0319559 | A1 * | 10/2014 | Guo ....................... H01L 33/0079 257/97 |

FOREIGN PATENT DOCUMENTS

| | | |
|---|---|---|
| JP | 61106497 A | 5/1986 |
| JP | 2000312032 A | 11/2000 |
| JP | 2000332229 A | 11/2000 |
| JP | 2003077840 A | 3/2003 |
| JP | 2003309291 | 10/2003 |
| JP | 2003338662 | 11/2003 |
| WO | WO 2013015035 A1 * | 1/2013 ............. H01L 33/06 |

* cited by examiner

|  | Brightness at 20mA (mcd) | Forward bias at 20mA (V) | Leakage current at -5V ($\mu$A) | Reverse voltage at -10 $\mu$A (V) |
|---|---|---|---|---|
| Buffer provided by two-step growth method | 37~40 | 3.14~3.25 | 0.00~0.01 | 24~32 |
| Nitride-based buffer layer provided by the present disclosure | 38~42 | 3.17~3.24 | 0.00~0.01 | 20~33 |

FIG. 8

NITRIDE-BASED SEMICONDUCTOR LIGHT-EMITTING DEVICE

REFERENCE TO RELATED APPLICATION

The present application is a continuation-in-part application of U.S. patent application Ser. No. 14/029,297, filed on Sep. 17, 2013, now pending, which is a continuation-in-part application of U.S. patent application Ser. No. 13/776,312, filed on Feb. 25, 2013, now U.S. Pat. No. 8,562,738, issued on Oct. 22, 2013, which is a continuation-in-part application of U.S. patent application Ser. No. 13/046,490, filed on Mar. 11, 2011, now U.S. Pat. No. 8,536,565, issued on Sep. 17, 2013, which is a divisional of U.S. patent application Ser. No. 12/270,828, filed on Nov. 13, 2008, now U.S. Pat. No. 7,928,424, issued Apr. 19, 2011, which is a continuation-in-part of U.S. patent application Ser. No. 10/711,567, filed on Sep. 24, 2004, now U.S. Pat. No. 7,497,905, issued Mar. 3, 2009, and which claims the right of priority based on Taiwan Application Serial Number 093106415, filed Mar. 11, 2004, the disclosure of which is incorporated herein by reference in their entireties.

TECHNICAL FIELD

The present disclosure provides a nitride-based semiconductor light-emitting device, especially a nitride-based semiconductor light-emitting device including a nitride-based buffer layer.

DESCRIPTION OF BACKGROUND ART

The applications of light-emitting diodes are extensive, such as optical display devices, traffic signals, data storing devices, communication devices, illumination devices, and medical apparatuses. It is important to increase the brightness of light-emitting diodes, and to simplify manufacturing processes in order to decrease the cost of the light-emitting diode.

In general, a conventional nitride-based light-emitting device includes a nitride-based buffer layer composed of group AlGaInN and formed over a sapphire substrate, and a nitride-based epitaxy process is undergone on the nitride-based buffer layer to form a nitride-based light-emitting device. Due to the mismatching of the crystal lattice constants, the dislocation density (which affects the quality of the conventional nitride-based light-emitting device) cannot be decreased efficiently. Therefore, in order to improve the quality of the conventional nitride-based light-emitting device, the conventional nitride-based epitaxy process is mended as a two-step growth method. The two-step growth includes utilizing low-temperature (500 to 600° C. GaN for forming a buffer layer, and a heating process (reaching a temperature of 1000 to 1200° C.) for crystallization. After the two-step growth, an epitaxy process for each epitaxy stack layer is proceeded. The thickness and temperature of the buffer layer, the recovery of the heating and re-crystallization processes, plus the ratio and flow rate of gas for each reaction must be controlled precisely, thus the manufacturing process becomes complicated and difficult, and the manufacturing efficiency cannot be increased.

In addition, the nitride-based light-emitting device can be further connected to other components in order to form a light emitting apparatus. The nitride-based light-emitting device may be mounted onto a submount with the side of the substrate, or a solder bump or a glue material may be formed between the submount and the nitride-based light-emitting device, therefore a light-emitting apparatus is formed. Besides, the submount further comprises the circuit layout electrically connected to the electrode of the nitride-based light-emitting device via an electrical conductive structure such as a metal wire.

SUMMARY OF THE APPLICATION

A nitride-based semiconductor light-emitting device includes: a light-emitting stack comprising a first semiconductor structure having a first conductivity, a second semiconductor structure having a second conductivity, and an active region interposed the first semiconductor structure and the second semiconductor structure; a semiconductor buffer structure formed under the first semiconductor structure; and an un-doped or unintentionally-doped AlGaN based layer formed between the first semiconductor structure and the semiconductor buffer structure.

BRIEF DESCRIPTION OF THE DRAWINGS

FIG. 8 illustrates a comparison table of blue light-emitting diodes between one made by an embodiment of the present disclosure and one fabricated by the conventional two-step growth method.

DETAILED DESCRIPTION OF PREFERRED EMBODIMENTS

Figure 1:
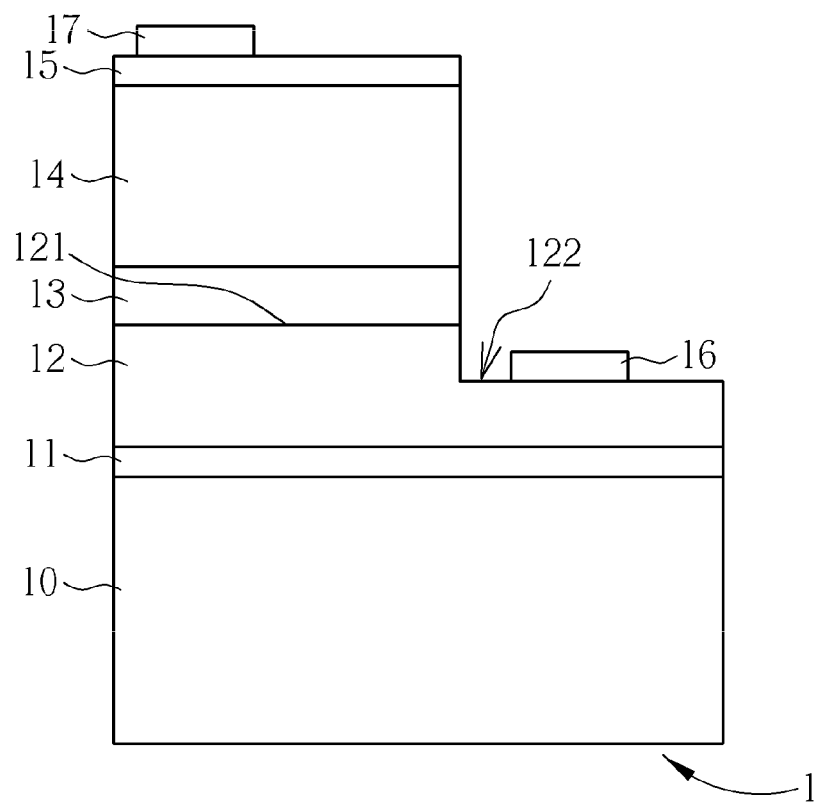
FIG. 1 illustrates a schematic diagram of a nitride-based light-emitting device with a nitride-based buffer layer according to an embodiment of the present application.

Please refer to FIG. 1, which illustrates a schematic diagram of a nitride-based light-emitting device 1 with an AlGaN buffer layer according to the first embodiment of the present disclosure. The nitride-based light-emitting device 1 includes a sapphire substrate 10, an AlGaN buffer layer 11 formed over the sapphire substrate 10, a nitride-based stack layer 12 made of n-type semiconductor and formed over the AlGaN buffer layer 11 with an epitaxy area 121 and an n-type electrode contact area 122, a multi-quantum well light-emitting layer 13 made of nitride materials like GaN/InGaN formed over the epitaxy area 121, a nitride-based stack layer 14 made of p-type semiconductor and formed over the multi-quantum well light-emitting layer 13, a metal transparent conductive layer 15 formed over the nitride-based stack layer 14, an n-type electrode 16 formed over the n-type electrode contact area 122, and a p-type electrode 17 formed over the metal transparent conductive layer 15.

A method for forming the above-mentioned AlGaN buffer layer of the nitride-based light-emitting device 1 is performed in the following steps:

(a) introducing an Al-contained organometallic reaction source like TMAl at 800° C. for forming an aluminum-rich transient layer;

(b) introducing a Ga-contained organometallic reaction source like TMGa and a nitrogen reaction source $NH_3$ under a lower mole flow ratio (V/III<1000);

(c) raising the growth temperature to 1050° C. and growing a high-temperature GaN layer with a higher mole flow ratio (V/III>2000).

During the growth of GaN layer, the Al atoms of the aluminum-rich transient layer, the Ga atoms, and the N atoms in the region close to the transient layer are rearranged. The Al atoms are diffused upward and the Ga atoms and N atoms are diffused downward. Hence, the composition of the AlGaN buffer layer changes gradually, and the AlGaN buffer layer is grown as a single crystal structure. The concentrations of the Al, Ga, and N atom add up to one. The portion of the AlGaN buffer layer close to the substrate has higher concentration of the Al atom than that of the Ga atom, and the combined concentration of the Al and Ga atom is greater than that of the N atom. The portion of the AlGaN buffer layer away from the substrate has a lower concentration of the Al atom than that of the Ga atom. In addition, the AlGaN buffer layer has higher concentration of the N atom away from the substrate and lower concentration of the N atom close to the substrate. Then, the Al, Ga, and N atoms are bonded together to form an AlGaN buffer layer.

Another method for forming the above-mentioned AlGaN buffer layer of the nitride-based light-emitting device 1 is performed in the following steps:

(a) introducing an Al-contained organometallic reaction source TMAl at 1020° C. for forming an aluminum-rich transient layer;

(b) introducing a Ga-contained organometallic reaction source TMGa and an nitrogen reaction source $NH_3$ at the same temperature as in step (a) to grow the high-temperature GaN layer.

The method for forming the nitride-based light-emitting device 1 further includes a step of introducing a carrier gas into a reaction chamber before forming the above-mentioned AlGaN buffer layer. The carrier gas can be used to clean the surface contaminates of the substrate. In an example of the embodiment, the carrier gas also can be used to nitridate the surface of the substrate, and the epitaxial quality of the following semiconductor layer is improved by the nitridation.

Before introducing the carrier gas, the reaction chamber temperature is raised and the substrate in the reaction chamber is heated to reach a pre-determined temperature at first. In one embodiment, the pre-determined temperature is above 900° C. In an example of the embodiment, the pre-determined temperature can be above 1000° C. or 1100° C. The substrate is baked under the pre-determined temperature in a period of a first baking time, such as 10 minutes. Then the carrier gas is introduced to the reaction chamber continuously and the substrate is baked at the same temperature in a period of a second baking time with the carrier gas atmosphere. In an example of the embodiment, the second baking time is carried out for at least 10 seconds and less than 2 minutes. The second baking time is related to the growth rate of the semiconductor layer formed on the substrate, such as the above-mentioned AlGaN buffer layer. The second baking can be carried out at a reduced pressure environment, such as at a pressure lower than 350 mbar. In an example of the embodiment, the pressure is lower than 250 mbar or 150 mbar. The carrier gas comprises hydrogen gas, hydrogen-containing compound gas, nitrogen gas, or a mixed gas of hydrogen gas and nitrogen gas ($H_2+N_2$). An example of the hydrogen-containing compound gas comprises ammonia ($NH_3$).

During the growth of GaN layer, the Al atoms of the aluminum-rich transient layer, the Ga atoms, and the N atoms in the region close to the transient layer are rearranged. The Al atoms are diffused upwards, and the Ga atoms and N atoms are diffused downwards. Hence, the composition of the AlGaN buffer layer changes gradually, and the AlGaN buffer layer is grown as a single crystal structure. The concentrations of the Al, Ga, and N atom add up to one. The portion of the nitride-based buffer layer close to the substrate has higher concentration of the Al atom than that of the Ga atom, and the combined concentration of the Al and Ga atom is greater than that of the N atom. The portion of the nitride-based buffer layer away from the substrate has a lower concentration of the Al atom than that of the Ga atom. In addition, the nitride-based buffer layer has higher concentration of the N atom away from the substrate and lower concentration of the N atom close to the substrate. Then, the Al, Ga and N atoms are bonded together to form the AlGaN buffer layer.

Figure 2:
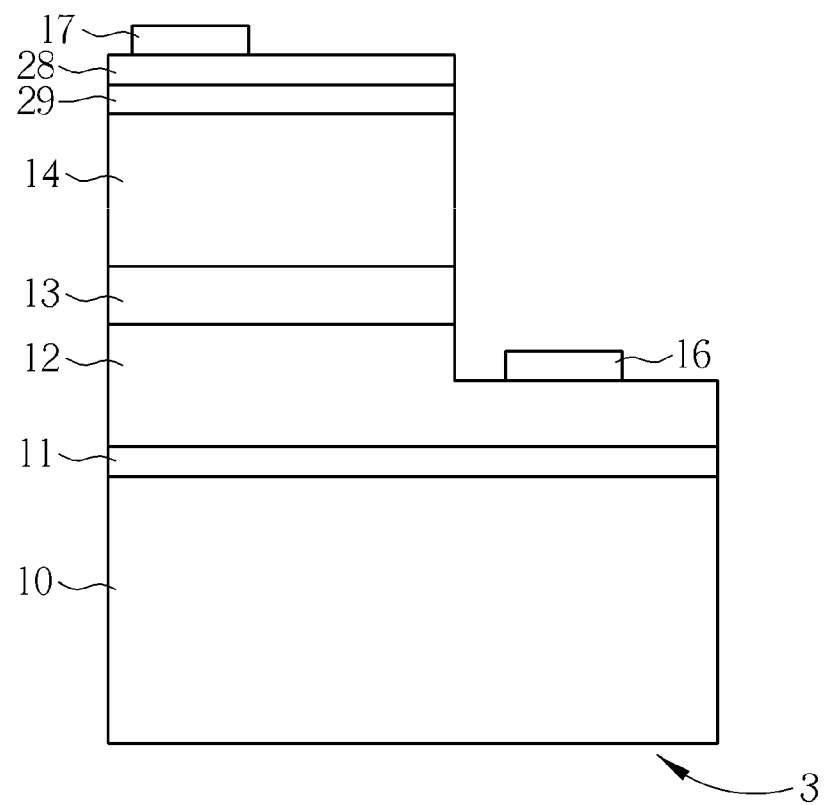
FIG. 2 illustrates a schematic diagram of a nitride-based light-emitting device with a nitride-based buffer layer according to an embodiment of the present application.

Please refer to FIG. 2, which illustrates a schematic diagram of a nitride-based light-emitting device 3 with an AlGaN buffer layer according to another embodiment of the present disclosure. Differences between the nitride-based light-emitting device 1 and the nitride-based light-emitting device 3 include a transparent oxide contact layer 28 of the nitride-based light-emitting device 3 formed over the nitride-based stack layer instead of the metal transparent conductive layer 15 of the nitride-based light-emitting device 1, and a highly-doped n-type reverse tunneling contact layer 29 of the nitride-based light-emitting device 3 with a thickness of less than 10 nm and doping concentration greater than $1 \times 10^{19}$ $cm^{-3}$ formed between the nitride-based stack layer 14 and the transparent oxide contact layer 28 so that an ohmic contact is formed between the transparent oxide contact layer 28 and the highly-concentrated n-type reverse tunneling contact layer 29. When the nitride-based light-emitting device 3 is operated in forward bias, the interface between the highly-concentrated n-type reverse tunneling contact layer 29 and the nitride-based stack layer 14 is in the reverse bias mode and forms a depletion region.

In addition, carriers of the transparent oxide contact layer 28 can punch through the nitride-based stack layer 14 because of the tunneling effect, which makes the operating bias of the nitride-based light-emitting device 3 reaching the same level as the conventional LED with a metal transparent conductive layer.

The AlGaN buffer layers of the nitride-based light-emitting devices 1 and 3 can be replaced with other nitride-based buffer layers, such as InGaN or InAlN buffer layer.

Figure 3:
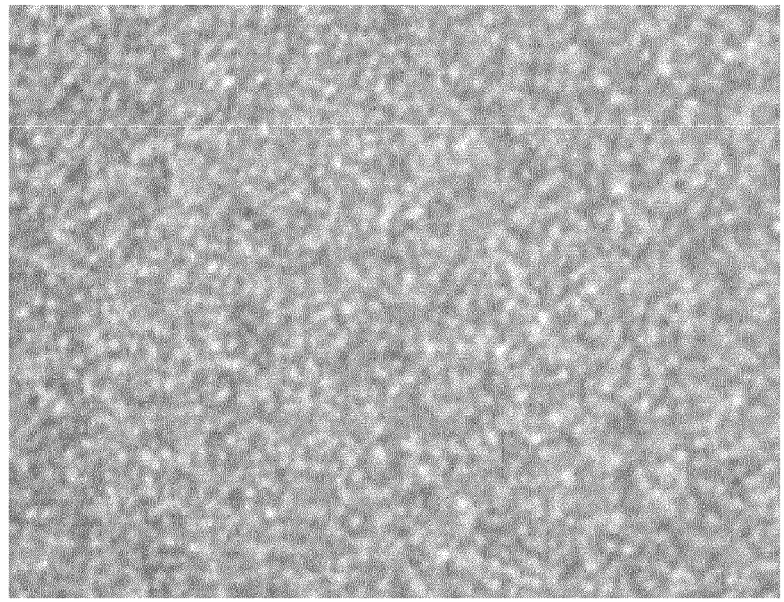
FIG. 3, FIG. 4, and FIG. 5 are photographs illustrating surface morphologies of epi-wafers by an interference optical microscope.
Figure 4:
Figure 5:

Please refer to FIG. 3, FIG. 4, and FIG. 5, which are photographs illustrating surface morphologies of epi-wafers examined under an interference optical microscope. FIG. 3 shows a surface without any buffer layer; FIG. 4 shows a surface with a conventional GaN buffer layer fabricated by a conventional two-step growth method; FIG. 5 shows a surface of the AlGaN buffer layer on which the GaN layer is grown according to the embodiment of the present disclosure. The surface without any buffer layer forms a hazy surface indicating that it is a non-single crystalline structure, while the surface of the AlGaN buffer layer forms a mirror-like surface.

Figure 6:
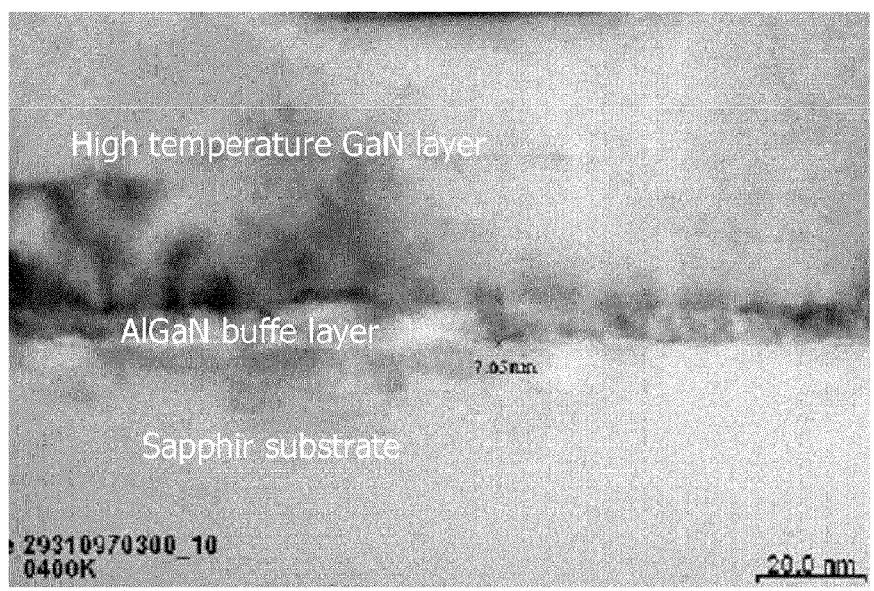
FIG. 6 illustrates a cross-sectional picture taken by a transmission electron microscope.

Furthermore, comparing to other conventional buffer layers which also have mirror-like surfaces, the thickness of the nitride-based buffer layer in the embodiments of the present disclosure is thinner. Please refer to FIG. 6, which is a cross-sectional picture taken by a transmission electron microscope. It is obviously shown that the thickness of the buffer layer is only around 7 nm, in contrast to a thickness of 20 to 40 nm of a buffer layer derived from the conventional two-step growth method.

Figure 7:
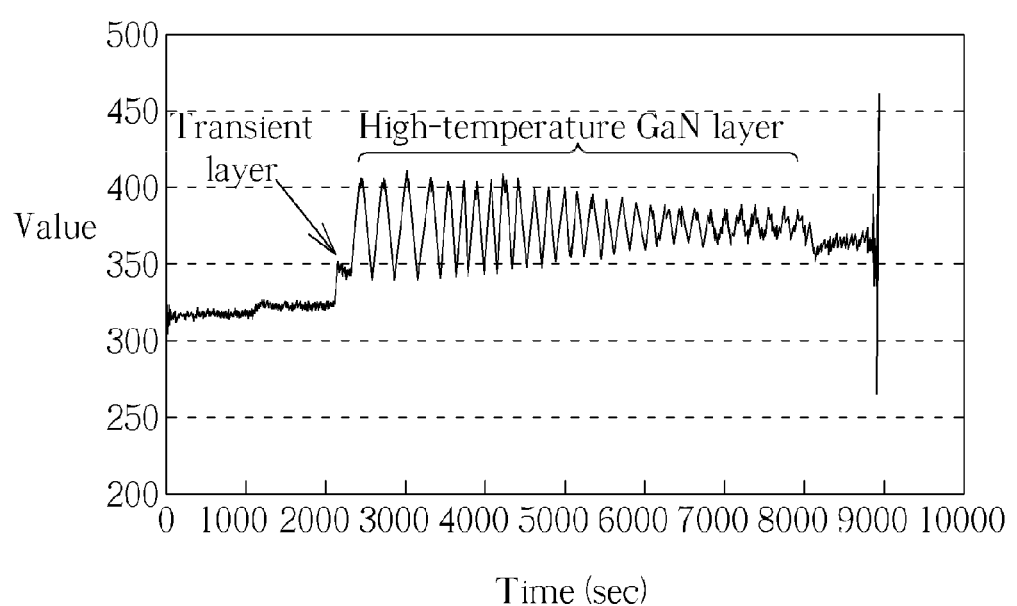
FIG. 7 shows a reflectance spectrum of an embodiment of the present disclosure measured by in-situ monitoring when growing a slightly Si-doped GaN layer.

Please refer to FIG. 7, which shows a reflectance spectrum of the present disclosure by in-situ monitor while growing a slightly Si-doping GaN layer. It illustrates signals from forming the transient layer for forming the buffer layer to the GaN layer formed on the buffer layer in a high temperature. The crystal quality has been characterized by XRC and Hall measurements. The GaN layer of one embodiment of the present disclosure has a full width at half maximum (FWHM) of XRC of 232 arcsec, and the mobility of Hall carriers can reach as high as 690 cm$^2$/V·s while the concentration of Hall carriers being $1\times10^{17}$ cm$^{-3}$. Relatively, the GaN layer fabricate by the conventional two-step growth method has a wider XRC FWHM of 269 arcsec, and a lower mobility of 620 cm$^2$/V·s of Hall carriers under the similar concentration of Hall carriers. It strongly indicates that the crystal quality of the GaN layer in the present disclosure is significantly improved when compared with the one fabricated by the conventional two-step growth method.

Furthermore, we have made a comparison between a blue light-emitting diode of the present disclosure and the one fabricated by the conventional two-step growth method. Please refer to FIG. 8, which illustrates a table of a comparison between a blue light-emitting diode fabricated by the method disclosed in the present disclosure and the one fabricated by the conventional two-step growth method. From the table 100, it can be seen that in terms of brightness, under a condition of a forward voltage at 20 mA, a leakage current at −5V, and a reverse voltage at −10 μA, a blue light-emitting diode of the present disclosure are comparable to the one fabricated by the conventional two-step growth method. In addition, the reliability of the blue light-emitting diode of the present disclosure is also comparable to that of the one fabricated by the conventional two-step growth method. Therefore, the manufacture process of the present disclosure provides devices with a simpler process.

Figure 9:
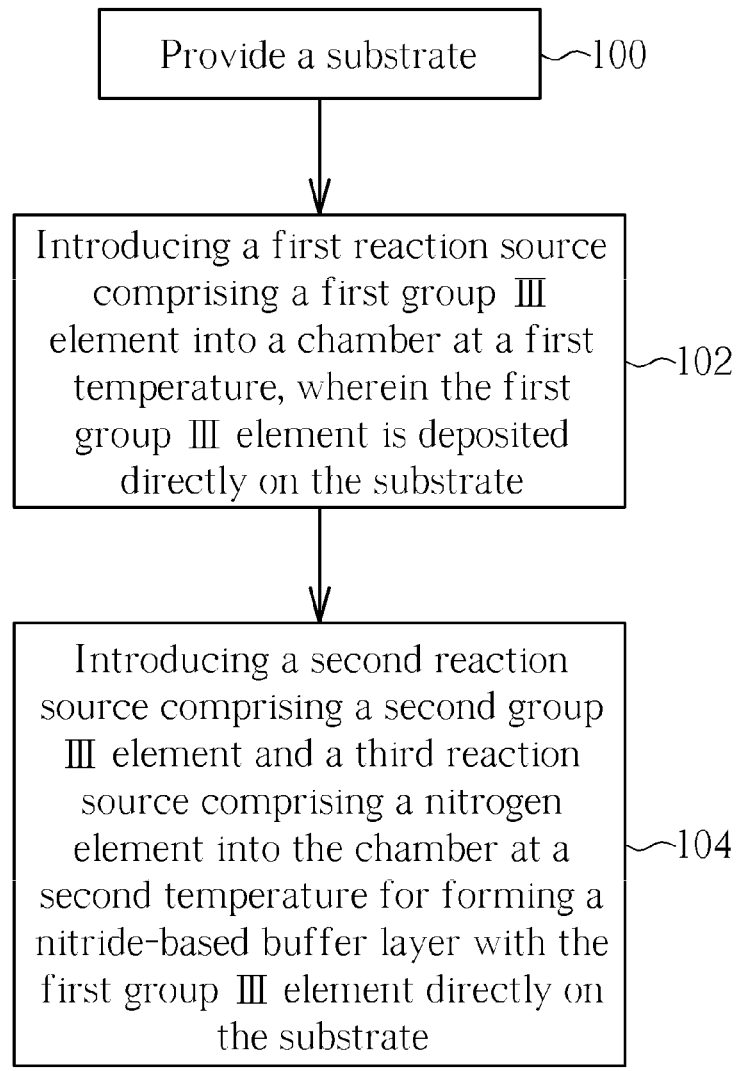
FIG. 9 illustrates a flowchart of summarizing the method of growing an AlGaN buffer layer of the nitride-based light-emitting device according to an embodiment of the present application.

FIG. 9 shows a flowchart of the method of growing an AlGaN buffer layer of the nitride-based light-emitting device 1 according to an embodiment of the present disclosure. A substrate is provided in step 100. Next, in step 102, a first reaction source containing a first group III element is introduced into a chamber at a first temperature. The melting point of the first group III element is lower than the first temperature, and the first group III element is deposited directly on the substrate. Then, in step 104, a second reaction source containing a second group III element and a third reaction source containing a nitrogen element are introduced into the chamber at a second temperature for forming a nitride-based buffer layer with the first group III element on the substrate. The second temperature is not lower than the melting point of the first group III element.

Figure 10:
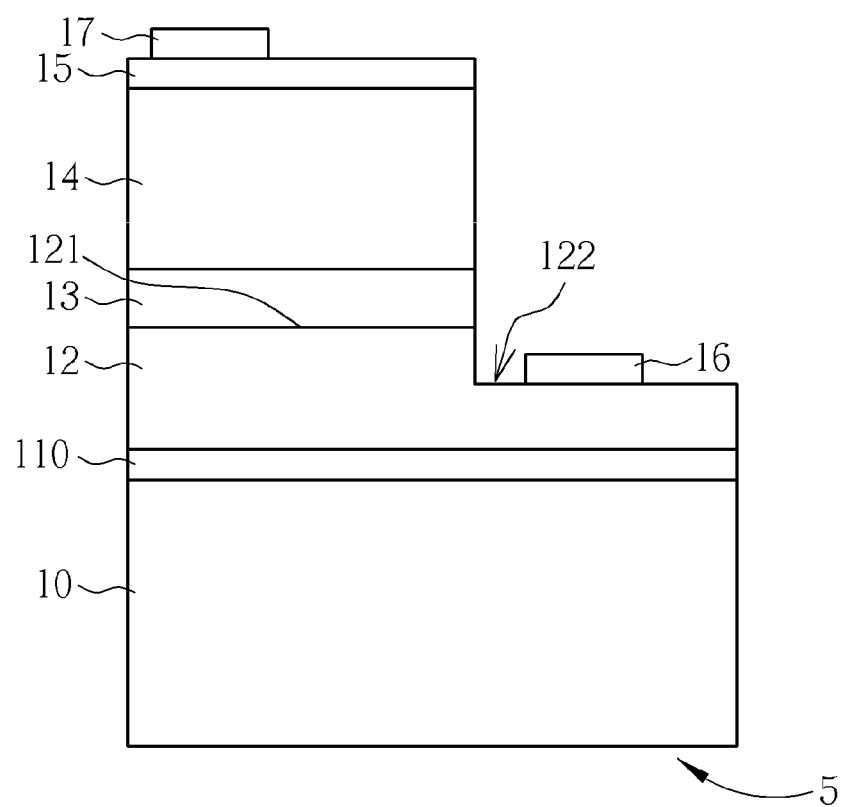
FIG. 10 illustrates a schematic diagram of a nitride-based light-emitting device with an MN buffer layer according to an embodiment of the present application.
Figure 12:
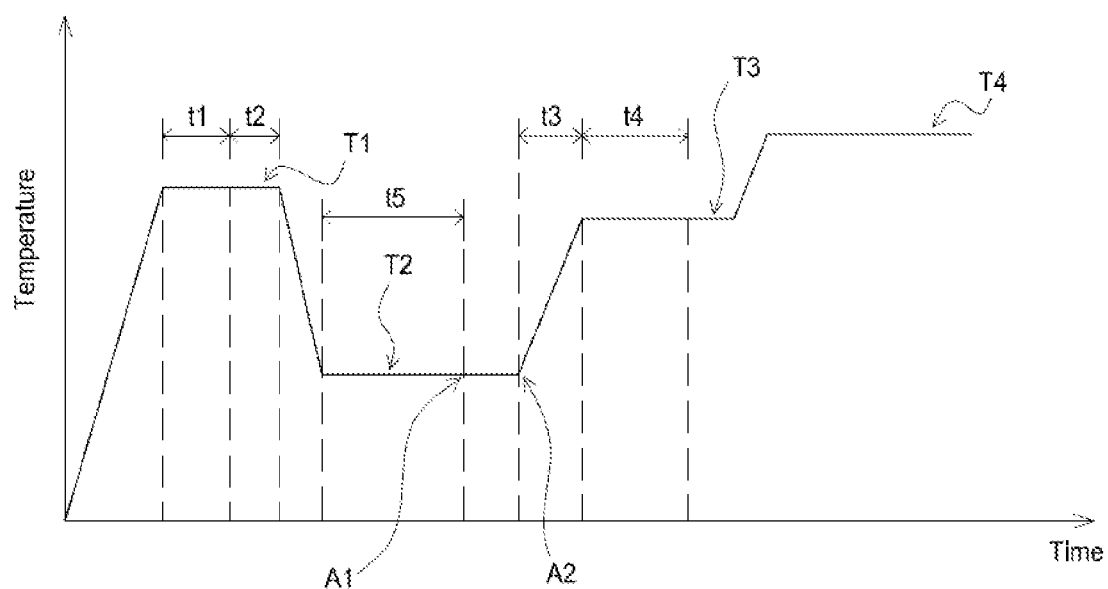
FIG. 12 illustrates a temperature profile of a nitride-based light-emitting device with an MN buffer layer according to an embodiment of the present application.

Please refer to FIG. 10, which illustrates a schematic diagram of a nitride-based light-emitting device 5 with an MN buffer layer according to the third embodiment of the present disclosure. FIG. 12 also illustrates a temperature profile of a nitride-based light-emitting device 5 with an MN buffer layer according to the third embodiment of the present disclosure. The structure of the nitride-based light-emitting device 5 is the same as the nitride-based light-emitting device 1. The difference between the nitride-based light-emitting device 1 and the nitride-based light-emitting device 5 include the material of the buffer layer 11 of the nitride-based light-emitting device 5 is MN. Methods for forming the above-mentioned MN buffer layer 110 of the nitride-based light-emitting device 5 are given as follows:

Method (A):

(a) introducing an Al-contained organometallic reaction source TMAl at a first temperature T2, about 800° C. for forming an aluminum-rich transient layer whose thickness is around 2 to 15 nm;

(b) during the period t3 of raising the growth temperature from the first temperature T2 to a second temperature T3, the second temperature T3 can be about 1050° C. for example, and introducing the Al-contained organometallic reaction source TMAl continuously and introducing additional nitrogen reaction source NH$_3$ simultaneously under a lower mole flow ratio (V/III<1000) for forming an aluminum-rich AlN layer whose thickness is around 2 to 5 nm;

(c) at the second temperature T3, such as the growth temperature of about 1050° C., continuing introducing the Al-contained organometallic reaction source TMAl and the nitrogen reaction source NH$_3$ simultaneously during a period t4 for growing the AlN buffer layer 110 whose thickness is around 3 to 10 nm. Afterwards, at the same temperature, such as the second temperature T3, or a higher temperature, such as a third temperature T4, other layers of the nitride-based light-emitting device 5 are formed;

(d) after the period t4 elapsed, stopping introducing the Al-contained organometallic reaction source TMAl, but continuing introducing the nitrogen reaction source NH$_3$ and starting introducing the organometallic reaction source containing group III element, such as TMGa, at the second temperature T3;

(e) raising the growth temperature from the second temperature T3 to a third temperature T4 wherein the third temperature T4 can be about 3040° C. higher than the second temperature T3 for example, and continuing introducing the nitrogen reaction source NH$_3$ and the organometallic reaction source containing group III element, such as TMGa. Other layers of the nitride-based light-emitting device 5, such as the nitride-based stack layer 12 made of n-type semiconductor material, for example n-GaN, is formed over the AlN buffer layer 110.

Method (B):

(a) introducing an Al-contained organometallic reaction source TMAl at a first temperature T2, about 800° C. for forming an aluminum-rich transient layer whose thickness is around 2 to 15 nm;

(b) during the period t3 of raising the growth temperature from the first temperature T2 to a second temperature T3, the second temperature T3 can be about 1050° C. for example, and introducing additional nitrogen reaction source NH$_3$ simultaneously under a lower mole flow ratio (V/III<1000) for forming an aluminum-rich AlN layer whose thickness is around 2 to 10 nm;

(c) at the second temperature T3, such as the growth temperature of about 1050° C., stopping introducing the Al-contained organometallic reaction source TMAl and keeping introducing the nitrogen reaction source NH$_3$ during a period t4 for reacting with the aluminum-rich transient layer and the aluminum-rich AlN layer to form the AlN buffer layer 110. Afterwards, at the same temperature, such as the second temperature T3, or at a higher temperature, such as a third temperature T4, other layers of the device 5 are formed;

(d) after the period t4 elapsed, continuing introducing the nitrogen reaction source NH$_3$ and starting introducing the organometallic reaction source containing group III element, such as TMGa, at the second temperature T3;

(e) raising the growth temperature from the second temperature T3 to a third temperature T4 wherein the third temperature T4 can be about 30~40° C. higher than the second temperature T3 for example, and continuing introducing the nitrogen reaction source NH$_3$ and the organometallic reaction source containing group III element, such as TMGa. Other layers of the nitride-based light-emitting device 5, such as the nitride-based stack layer 12 made of n-type semiconductor material, for example n-GaN, is formed over the AlN buffer layer 110.

Method (C):

(a) introducing an Al-contained organometallic reaction source TMAl at a first temperature T2, about 800° C. for forming an aluminum-rich transient layer whose thickness is around 2 to 15 nm;

(b) raising the growth temperature from the first temperature T2 to a second temperature T3, the second temperature T3 can be about 1050° C. for example, and during the temperature-raising period t3, stopping introducing the Al-contained organometallic reaction source TMAl and introducing nitrogen reaction source NH$_3$ for reacting with the aluminum-rich transient layer to form the AlN buffer layer 110;

(c) at the second temperature T3, such as the growth temperature of about 1050° C., reintroducing the Al-contained organometallic reaction source TMAl and continuing introducing the nitrogen reaction source NH$_3$ during a period t4 for growing the AlN buffer layer 110 whose thickness is around 5 to 15 nm. Afterwards, at the same temperature, such as the second temperature T3, or at a higher temperature, such as a third temperature T4, other layers of the device 5 are formed;

(d) after the period t4 elapsed, continuing introducing the nitrogen reaction source NH$_3$ and starting introducing the organometallic reaction source containing group III element, such as TMGa, at the second temperature T3;

(e) raising the growth temperature from the second temperature T3 to a third temperature T4 wherein the third temperature T4 can be about 3040° C. higher than the second temperature T3 for example, and continuing introducing the nitrogen reaction source NH$_3$ and the organometallic reaction source containing group III element, such as TMGa. Other layers of the nitride-based light-emitting device 5, such as the nitride-based stack layer 12 made of n-type semiconductor material, for example n-GaN, is formed over the AlN buffer layer 110.

Method (D):

(a) introducing an Al-contained organometallic reaction source TMAl at about 1020° C. for forming an aluminum-rich transient layer whose thickness is around 2 to 15 nm;

(b) continuing introducing Al-contained organometallic reaction source TMAl and introducing additional nitrogen reaction source NH$_3$ with a lower mole flow ratio (V/III<500) for forming an aluminum-rich AlN layer whose thickness is around 2 to 10 nm;

(c) at the growth temperature of about 1020° C., stopping introducing the Al-contained organometallic reaction source TMAl and continuing introducing the nitrogen reaction source NH$_3$ for reacting with the aluminum-rich transient layer and the aluminum-rich AlN layer to form the AlN buffer layer 110. Afterwards, at the same or at a higher temperature, other layers of the device 5 are formed.

Method (E):

(a) introducing an Al-contained organometallic reaction source TMAl at about 1020° C. for forming an aluminum-rich transient layer whose thickness is around 2 to 15 nm;

(b) continuing introducing the Al-contained organometallic reaction source TMAl and introducing additional nitrogen reaction source NH$_3$ simultaneously with a lower mole flow ratio (V/III<500) for forming an aluminum-rich AlN layer whose thickness is around 2 to 5 nm;

(c) at the growth temperature of about 1020° C., continuing introducing the Al-contained organometallic reaction source TMAl and the nitrogen reaction source NH$_3$, and increasing the flow of NH$_3$ to raise the mole flow ratio to more than 1000 (V/III>1000) for growing the AlN buffer layer 110 whose thickness is around 3 to 10 nm. Afterwards, at the same or a higher temperature, other layers of the device 5 are formed.

Method (F):

(a) introducing an Al-contained organometallic reaction source TMAl at about 1080° C. for forming an aluminum-rich transient layer whose thickness is around 2 to 15 nm;

(b) stopping introducing the Al-contained organometallic reaction source TMAl, and lowering the growth temperature to about 1040° C. During the lowering period, introducing additional nitrogen reaction source NH3 for reacting with the aluminum-rich transient layer to form an aluminum-rich AlN layer;

(c) at the growth temperature at about 1040° C., continuing introducing the Al-contained organometallic reaction source TMAl and the nitrogen reaction source NH$_3$ simultaneously, and increasing the flow of NH$_3$ to raise the mole flow ratio to more than 1000 (V/III>1000) for growing the AlN buffer layer 110 whose thickness is around 3 to 10 nm. Afterwards, at the same temperature of about 1040° C. or at a higher temperature between 1040° C. and 1080° C., other layers of the device 5 are formed.

Method (G):

(a) introducing an Al-contained organometallic reaction source TMAl at a first temperature T2, about 800° C. for forming an aluminum-rich transient layer whose thickness is around 2 to 15 nm;

(b) raising the growth temperature from the first temperature T2 to a second temperature T3, the second temperature T3 can be about 1050° C. for example, and during the temperature-raising period t3, stopping introducing the Al-contained organometallic reaction source TMAl, but continuing introducing nitrogen reaction source NH$_3$ for reacting with the aluminum-rich transient layer;

(c) at the second temperature T3, such as the growth temperature of about 1050° C., keeping introducing the nitrogen reaction source NH$_3$ during a period t4 for reacting with the aluminum-rich transient layer and the aluminum-rich MN layer to form the MN buffer layer 110. Afterwards, at the same temperature, such as the second temperature T3, or at a higher temperature, such as a third temperature T4, other layers of the device 5 are formed;

(d) after the period t4 elapsed, continuing introducing the nitrogen reaction source NH$_3$ and starting introducing the organometallic reaction source containing group III element, such as TMGa, at the second temperature T3;

(e) raising the growth temperature from the second temperature T3 to a third temperature T4, the third temperature T4 can be about 3040° C. higher than the second temperature T3 for example, and continuing introducing the nitrogen reaction source NH$_3$ and the organometallic reaction source containing group III element, such as TMGa. Other layers of the nitride-based light-emitting device 5, such as the nitride-based stack layer 12 made of n-type semiconductor material, for example n-GaN, is formed over the MN buffer layer 110.

The method for forming the nitride-based light-emitting device 5 further comprises a step of introducing a carrier gas into a reaction chamber before forming the above-mentioned MN buffer layer. The carrier gas can be used to clean the surface contaminates of the substrate. In an example of the embodiment, the carrier gas also can be used to nitridate the surface of the substrate, and the epitaxial quality of the following semiconductor layer is improved by the nitridation.

Before introducing the carrier gas, the reaction chamber temperature is raised and the substrate in the reaction chamber is heated to reach a pre-determined temperature T1 at first. In one embodiment, the pre-determined temperature T1 is above 900° C. In an example of the embodiment, the pre-determined temperature T1 can be above 1000° C. or 1100° C. The substrate is baked under the pre-determined temperature T1 in a period of a first baking time t1, such as 10 minutes. Then, the carrier gas is introduced to the reaction chamber continuously and the substrate is baked at the same temperature, such as the pre-determined temperature T1, in a period of a second baking time t2 with the carrier gas atmosphere. In an example of the embodiment, the second baking time t2 is carried out for at least 10 seconds and less than 2 minutes. The second baking time t2 is related to the growth rate of the semiconductor layer formed on the substrate, such as the above-mentioned MN buffer layer. The second baking can be carried out at a reduced pressure environment, such as at a pressure lower than 350 mbar. In an example of the embodiment, the pressure is lower than 250 mbar or 150 mbar. The carrier gas comprises hydrogen gas, hydrogen-containing compound gas, nitrogen gas, or a mixed gas of hydrogen gas and nitrogen gas (H$_2$+N$_2$). An example of the hydrogen-containing compound gas comprises ammonia (NH$_3$).

After nitridating the surface of the substrate with ammonia (NH$_3$), for example, a temperature of the reaction chamber is cooled down from the pre-determined temperature T1, such as 1130° C., to the first temperature T2, such as 840° C., and the first temperature T2 is maintained for a period t5. During the cooling, an environment gas such as hydrogen gas or nitrogen gas is continuously introduced into the reaction chamber while ammonia (NH$_3$) introducing is stopped. As shown in FIG. 12, after the period t5 elapsed, and the reaction chamber and the substrate reached a thermal equilibrium state, such as from point A1 to point A2, Al-contained organometallic reaction source TMAl can be introduced into the reaction chamber at the first temperature T2. And then forming the above-mentioned MN buffer layer 110 of the nitride-based light-emitting device 5 in accordance with one of the method (A) to method (G).

During the growth of MN layer, the Al atoms of the aluminum-rich transient layer and the N atoms in the region close to the transient layer are re-arranged. The Al atoms are diffused upwards and N atoms are diffused downwards. The Al atoms are introduced before the N atom, hence, the composition of the MN buffer layer changes gradually, and the MN buffer layer is grown as a single crystal structure. When forming the aluminum-rich transient layer, the temperature for forming the aluminum-rich transient layer is higher than the melting point of the Al atom to prevent a pure Al layer from being formed within the MN buffer layer. So is the temperature for forming the MN buffer layer. The pure Al layer is opaque and results in low efficiency in light-emitting, and concerns the epitaxy process of the following layers. The portion of the MN buffer layer close to the substrate has higher concentration of the Al atom than that of the N atom; the MN buffer layer has higher concentration of the N atom away from the substrate and lower concentration of the N atom close to the substrate.

Figure 11:
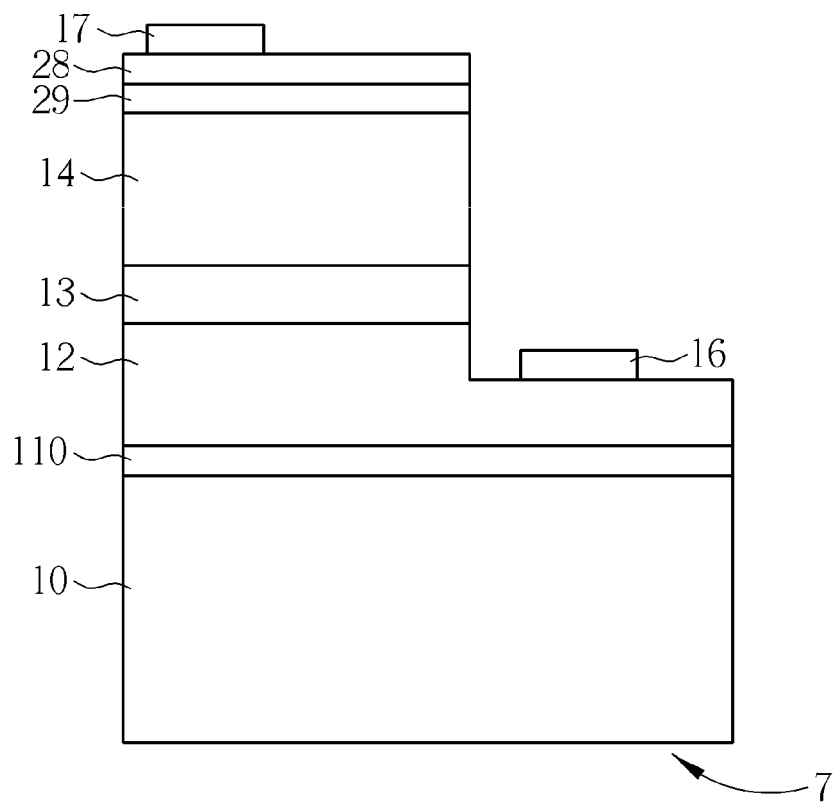
FIG. 11 illustrates a schematic diagram of a nitride-based light-emitting device with an MN buffer layer according to a fourth embodiment of the present application.

Please refer to FIG. 11, which illustrates a schematic diagram of a nitride-based light-emitting device 7 with an MN buffer layer according to a fourth embodiment of the present disclosure. The structure of the nitride-based light-emitting device 7 is the same as the nitride-based light-emitting device 3. The difference between the nitride-based light-emitting device 3 and the nitride-based light-emitting device 7 includes the material of the buffer layer 11 of the nitride-based light-emitting device 7 is MN.

In addition, the MN buffer layers of the nitride-based light-emitting devices 5 and 7 can be replaced with other binary nitride-based buffer layers, such as GaN or InN buffer layer.

In the nitride-based light-emitting devices 1 and 5, a transparent oxide contact layer can be formed over the nitride-based stack layer instead of the metal transparent conductive layer of the nitride-based light-emitting device 1 for increasing light-emitting efficiency owing to the higher light transmittance of the transparent oxide contact layer.

In the above-mentioned embodiments, the nitride-based stack layer made of p-type semiconductor further comprises a p-type nitride-based contact layer and a p-type nitride-based cladding layer, while the nitride-based stack layer made of n-type semiconductor further comprises an n-type nitride-based contact layer and an n-type nitride-based cladding layer. The p-type or n-type nitride-based contact layer and the p-type or n-type nitride-based cladding layer each includes a material selected from a material group consisting of AlN, GaN, InN, AlGaN, AlInN, InGaN, and AlInGaN, or other substitute materials. Besides sapphire, the substrate can be made of other material selected from a group consisting of SiC, GaAs, GaN, MN, GaP, Si, ZnO, MgO, and MgAl$_2$O$_4$, or other substitute materials, such as glass. The nitride-based stack layer made of n-type or p-type semiconductor includes a material selected from a group consisting of AlN, GaN, InN, AlGaN, AlInN, InGaN, and AlInGaN, or other substitute materials. The nitride-based multi-quantum well light-emitting layer includes a material selected from a group consisting of MN, GaN, InN, AlGaN, InGaN, AlInN, and AlInGaN or other substitute materials. The metal contact layer includes a material selected from a group consisting of Ni/Au, NiO/Au, Ta/Au, TiWN, and TiN, or other substitute materials. The transparent oxide contact layer includes a material selected from a group consisting of indium tin oxide, cadmium tin oxide, antimony tin oxide, zinc aluminum oxide, and zinc tin oxide, or other substitute materials.

Figure 13:
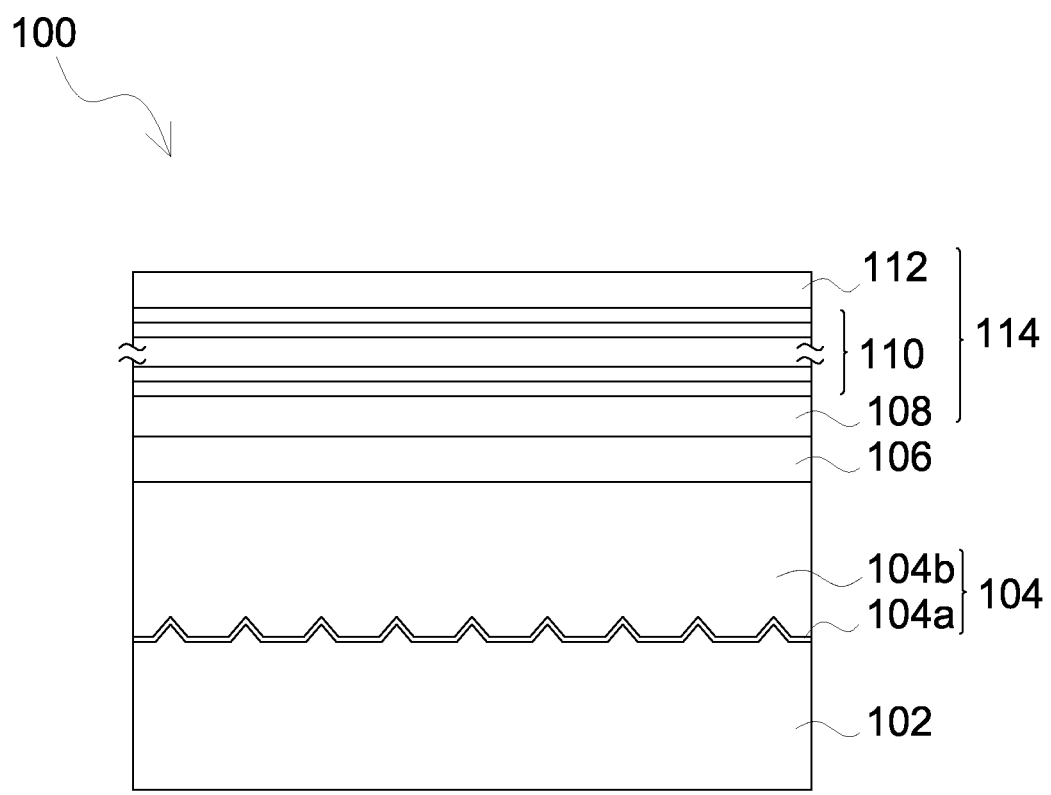
FIG. 13 illustrates a nitride-based semiconductor light-emitting device in accordance with a fifth embodiment of the present application.

Referring to FIG. 13, a nitride-based semiconductor light-emitting device in accordance with a fifth embodiment of the present application is disclosed. A nitride-based semiconductor light-emitting device 100 includes: a substrate 102; a light-emitting stack 114 formed on the substrate 102 and comprising a first semiconductor structure 108 having a first conductivity, a second semiconductor structure 112 having a second conductivity, and an active region 110 interposed the first semiconductor structure 108 and the second semiconductor structure 112; a semiconductor buffer structure 104 formed between the first semiconductor structure 108 and the substrate 102; and an un-doped or unintentionally-doped AlGaN based layer 106 formed between the first semiconductor structure 108 and the semiconductor buffer structure 104. The un-doped or unintentionally-doped AlGaN based layer 106 includes $Al_{x1}Ga_{1-x1}N$, and $0.08 \leq x1 \leq 0.12$. The first semiconductor structure 108 can include a contact layer (not shown) adjacent to the active region 110 and a clad layer (not shown) adjacent to the un-doped or unintentionally-doped AlGaN based layer 106, and the first semiconductor structure 108 does not contain the un-doped or unintentionally-doped AlGaN based layer 106. The un-doped or unintentionally-doped AlGaN based layer 106 includes an average sheet resistance between 350 Ω/sq to 470 Ω/sq so a current for driving the nitride-based semiconductor light-emitting device 100 injected into the first semiconductor structure 108 does not flow into the un-doped or unintentionally-doped AlGaN based layer 106. The first conductivity of the first semiconductor structure 108 includes n type, and the second conductivity of the second semiconductor structure 112 includes p type.

The substrate 102 can include a sapphire substrate having a regularly or irregularly uneven surface, and the semiconductor buffer structure 104, the un-doped or unintentionally-doped AlGaN based layer 106 and the light-emitting stack 114 are sequentially formed on the substrate 102 by epitaxial growth. The semiconductor buffer structure 104 can include an un-doped GaN 104b under the un-doped or unintentionally-doped AlGaN based layer 106, and an un-doped layer 104a including a low-temperature growth III-nitride layer or a high-temperature growth III-nitride layer under the un-doped GaN 104b. The un-doped or unintentionally-doped AlGaN based layer 106 directly contacts the un-doped GaN 104b of the semiconductor buffer structure 104 and is configured to reduce the lattice mismatch between the substrate 102 and the light-emitting stack 114, therefore crystal quality of the light-emitting stack 114 can be enhanced. The un-doped or unintentionally-doped AlGaN based layer 106 includes a thickness between 40 and 600 angstrom. The low-temperature growth III-nitride layer includes GaN, and the high-temperature growth III-nitride layer includes AlN or AlGaN. The un-doped GaN 104b can be thicker than the un-doped layer 104a and the un-doped or unintentionally-doped AlGaN based layer 106, and the un-doped or unintentionally-doped AlGaN based layer 106 can be thinner than the un-doped layer 104a. The proportion of III element of the un-doped layer 104a can be decreased in a direction from the substrate 102 to the un-doped GaN 104b and the proportion of nitride element thereof can be increased in a direction from the substrate 102 to the un-doped GaN 104b.

Figure 14:
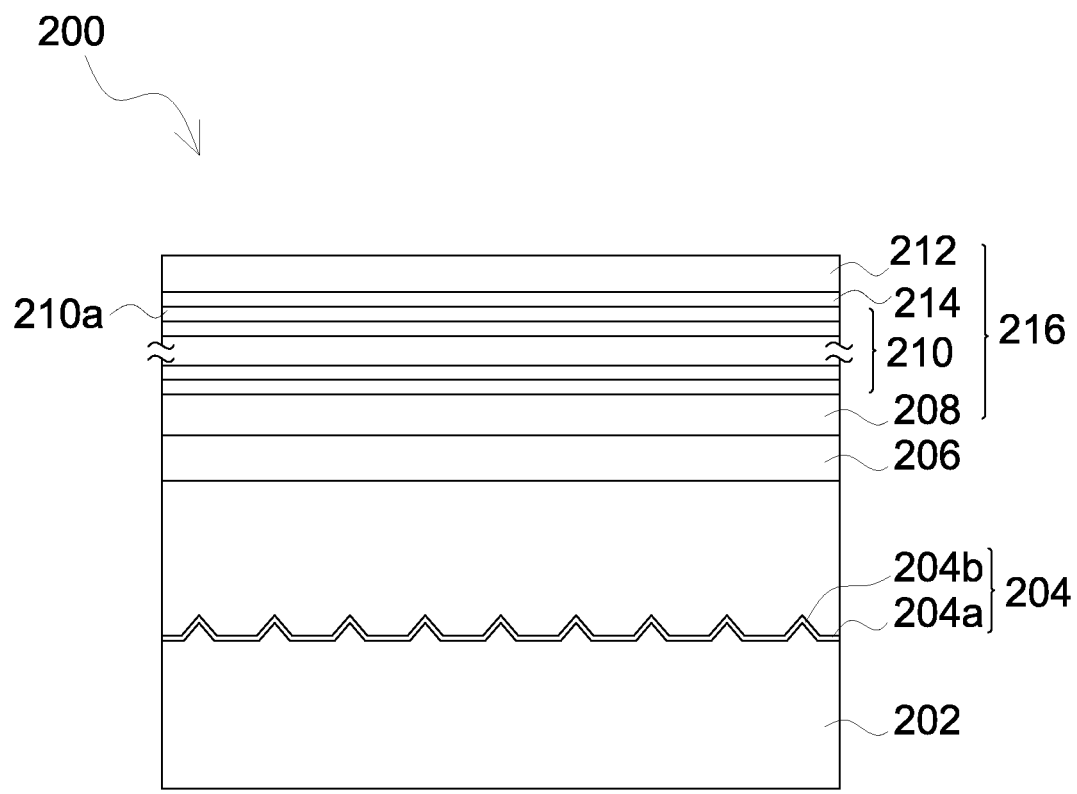
FIG. 14 illustrates a nitride-based semiconductor light-emitting device in accordance with a sixth embodiment of the present application.

Referring to FIG. 14, a nitride-based semiconductor light-emitting device in accordance with a sixth embodiment of the present application is disclosed. A nitride-based semiconductor light-emitting device 200 includes: a substrate 102; a light-emitting stack 216 formed on the substrate 202 and comprising a first semiconductor structure 208 having a first conductivity, a second semiconductor structure 212 having a second conductivity, and an active region 210 interposed the first semiconductor structure 208 and the second semiconductor structure 212; a semiconductor buffer structure 204 formed between the first semiconductor structure 208 and the substrate 202; and a first un-doped or unintentionally-doped AlGaN based layer 206 formed between the first semiconductor structure 208 and the semiconductor buffer structure 204. The first un-doped or unintentionally-doped AlGaN based layer 206 includes $Al_{x1}Ga_{1-x1}N$, and $0.08 \leq x1 \leq 0.12$. The first semiconductor structure 208 can include a contact layer (not shown) adjacent to the active region 210 and a clad layer (not shown) adjacent to the first un-doped or unintentionally-doped AlGaN based layer 206, and the first semiconductor structure 208 does not contain the un-doped or unintentionally-doped AlGaN based layer 206. The un-doped or unintentionally-doped AlGaN based layer 206 includes an average sheet resistance between 350 Ω/sq to 470 Ω/sq so a current for driving the nitride-based semiconductor light-emitting device 200 injected into the first semiconductor structure 208 does not flow into the un-doped or unintentionally-doped AlGaN based layer 206. The first conductivity of the first semiconductor structure 208 includes n type, and the second conductivity of the second semiconductor structure 212 includes p type.

The substrate 202 can include a sapphire substrate having a regular or irregular uneven surface, and the semiconductor buffer structure 204, the first un-doped or unintentionally-doped AlGaN based layer 206 and the light-emitting stack 216 are sequentially formed on the substrate 202 by epitaxial growth. The semiconductor buffer structure 204 can include an un-doped GaN 204b under the first un-doped or unintentionally-doped AlGaN based layer 206, and a layer 204a including a low-temperature growth III-nitride layer or a high-temperature growth III-nitride layer under the un-doped GaN 204b. The un-doped GaN 204b can be thicker than the un-doped layer 204a and the un-doped or unintentionally-doped AlGaN based layer 206, and the un-doped or unintentionally-doped AlGaN based layer 106 can be thinner than the un-doped layer 204a. The proportion of III element of the un-doped layer 204a can be decreased in a direction from the substrate 202 to the un-doped GaN 204b and the proportion of nitride element thereof can be increased in a direction from the substrate 202 to the un-doped GaN 204b.

A second un-doped or unintentionally-doped $Al_{x2}Ga_{1-x2}N$ 214 can be formed between the active region 210 and the second semiconductor structure 212, and $x_2 \leq 0.2$. The second un-doped or unintentionally-doped $Al_{x2}Ga_{1-x2}N$ 214 can be adjacent to a last barrier 210a of the active structure 210. The active region 210 includes alternate barriers and quantum wells, and the last barrier layer 210a is the one closest to the second semiconductor structure 212. The second un-doped or unintentionally-doped $Al_{x2}Ga_{1-x2}N$ 214 can prevent electrons from overflowing to the second semiconductor structure 212.

Figure 15:
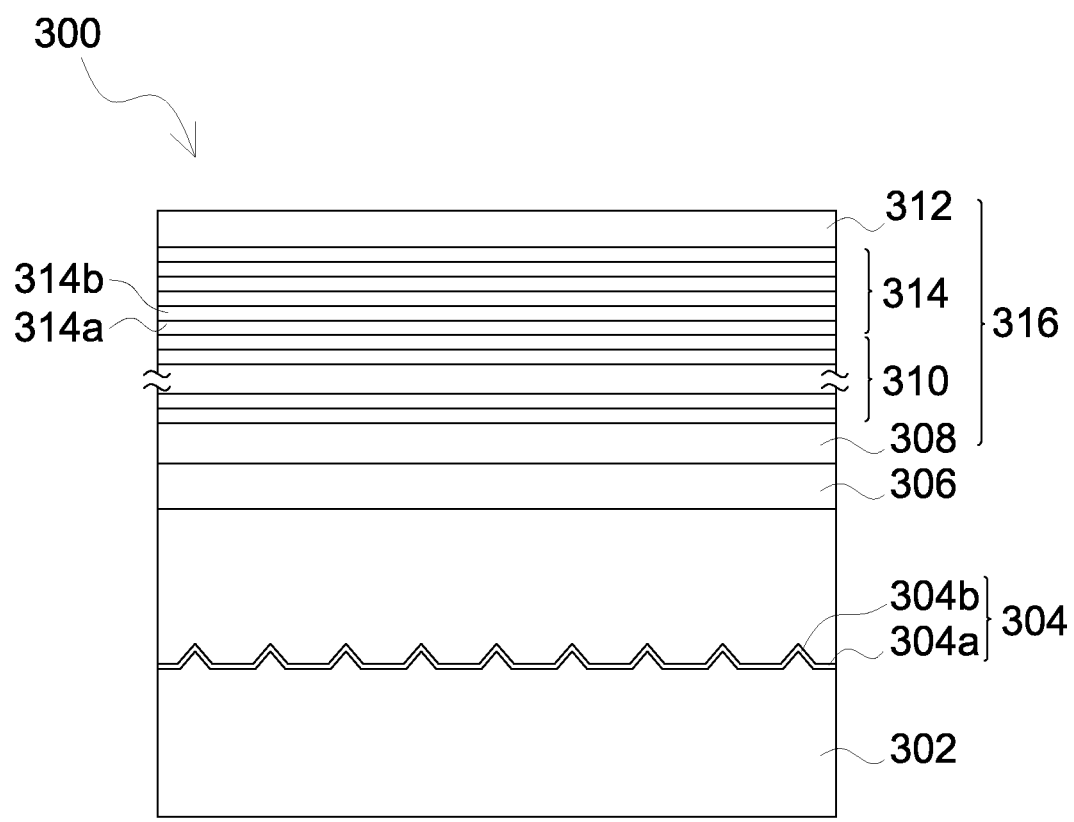
FIG. 15 illustrates a nitride-based semiconductor light-emitting device in accordance with a seventh embodiment of the present application.

Referring to FIG. 15, a nitride-based semiconductor light-emitting device in accordance with a seventh embodiment of the present application is disclosed. A nitride-based semiconductor light-emitting device 300 includes: a substrate 302; a light-emitting stack 316 formed on the substrate 302 and comprising a first semiconductor structure 308 having a first conductivity, a second semiconductor structure 312 having a second conductivity, and an active region 310 interposed the first semiconductor structure 308 and the second semiconductor structure 312; a semiconductor buffer structure 304 formed between the first semiconductor structure 308 and the substrate 302; and a first un-doped or unintentionally-doped AlGaN based layer 306 formed between the first semiconductor structure 308 and the semiconductor buffer structure 304. The first un-doped or unintentionally-doped AlGaN based layer 306 includes $Al_{x1}Ga_{1-x1}N$, and $0.08 \le x1 \le 0.12$. The first semiconductor structure 308 can include a contact layer (not shown) adjacent to the active region 310 and a clad layer (not shown) adjacent to the first un-doped or unintentionally-doped AlGaN based layer 306, and the first semiconductor structure 308 does not contain the un-doped or unintentionally-doped AlGaN based layer 306. The un-doped or unintentionally-doped AlGaN based layer 306 includes an average sheet resistance between 350 Ω/sq to 470 Ω/sq so a current for driving the nitride-based semiconductor light-emitting device 300 injected into the first semiconductor structure 308 does not flow into the un-doped or unintentionally-doped AlGaN based layer 306. The first conductivity of the first semiconductor structure 308 includes n type, and the second conductivity of the second semiconductor structure 312 includes p type.

The substrate 302 can include a sapphire substrate having a regularly or irregularly uneven surface, and the semiconductor buffer structure 304, the first un-doped or unintentionally-doped AlGaN based layer 306 and the light-emitting stack 316 are sequentially formed on the substrate 302 by epitaxial growth, The semiconductor buffer structure 304 can includes an un-doped GaN 304b under the first un-doped or unintentionally-doped AlGaN based layer 306, and a layer 304a including a low-temperature growth III-nitride layer or a high-temperature growth III-nitride layer under the un-doped GaN 304b. The un-doped GaN 304b can be thicker than the un-doped layer 304a and the un-doped or unintentionally-doped AlGaN based layer 306, and the un-doped or unintentionally-doped AlGaN based layer 106 can be thinner than the un-doped layer 304a. The proportion of III element of the un-doped layer 304a can be decreased in a direction from the substrate 302 to the un-doped GaN 304b and the proportion of nitride element thereof can be increased in a direction from the substrate 302 to the un-doped GaN 304b.

A superlattice structure 314 can be formed between the second semiconductor structure 312 and the active structure 310, and the superlattice structure 314 includes a first layer 314a and a second layer 314b alternately stacked with each other. The first layer 314a includes $Al_{x3}Ga_{1-x3}N$ and the second layer 314b includes $In_{x4}Ga_{1-x4}N$, and $0.15 \le x3 \le 0.2$; $0 \le x4 \le 0.1$. The first layer 314a and the second layer 314b can be alternately arranged for six to fifty times. The superlattice structure 314 can be functional to prevent electrons overflowing to the second semiconductor structure 312.

Figure 16:
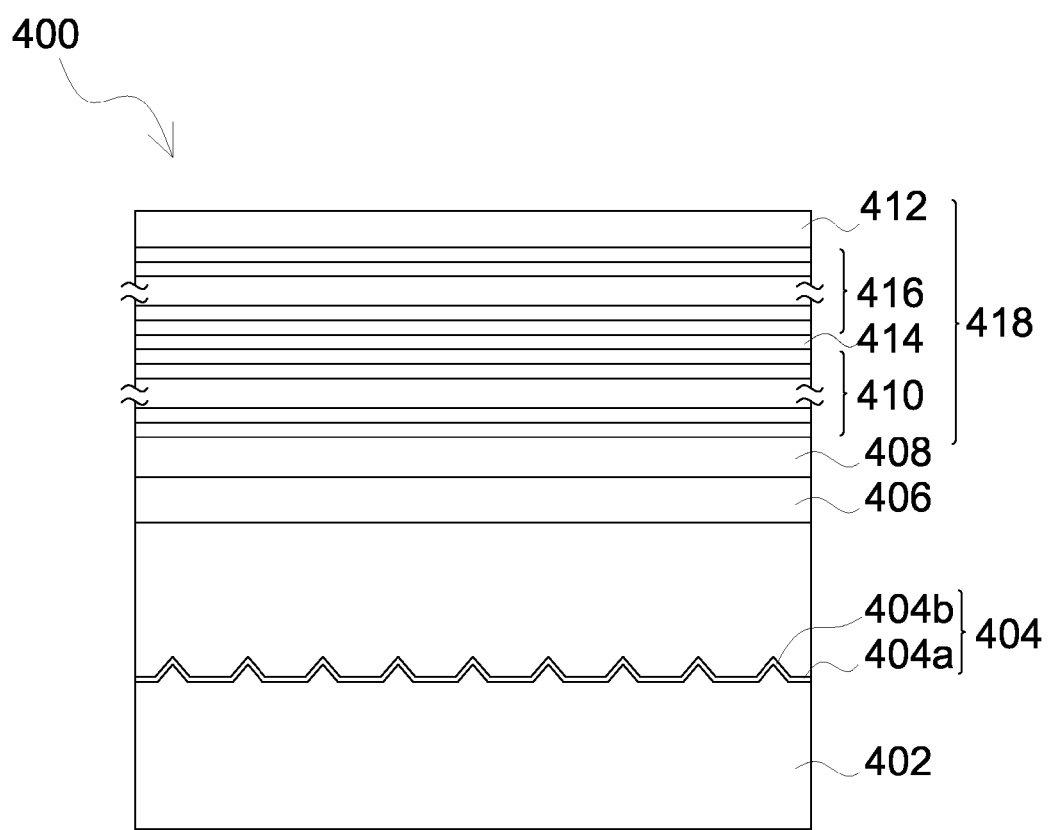
FIG. 16 illustrates a nitride-based semiconductor light-emitting device in accordance with an eighth embodiment of the present application.

Referring to FIG. 16, a nitride-based semiconductor light-emitting device in accordance with a eighth embodiment of the present application is disclosed. A nitride-based semiconductor light-emitting device 400 includes: a substrate 402; a light-emitting stack 416 formed on the substrate 402 and comprising a first semiconductor structure 408 having a first conductivity, a second semiconductor structure 412 having a second conductivity, and an active region 410 interposed the first semiconductor structure 408 and the second semiconductor structure 412; a semiconductor buffer structure 404 formed between the first semiconductor structure 408 and the substrate 402; and a first un-doped or unintentionally-doped AlGaN based layer 406 formed between the first semiconductor structure 408 and the semiconductor buffer structure 404. The first un-doped or unintentionally-doped AlGaN based layer 406 includes $Al_{x1}Ga_{1-x1}N$, and $0.085 \le x1 \le 0.12$. The first semiconductor structure 408 can include a contact layer (not shown) adjacent to the active region 410 and a clad layer (not shown) adjacent to the first un-doped or unintentionally-doped AlGaN based layer 406, and the first semiconductor structure 408 does not contain the un-doped or unintentionally-doped AlGaN based layer 406. The un-doped or unintentionally-doped AlGaN based layer 406 includes an average sheet resistance between 350 Ω/sq to 470 Ω/sq so a current for driving the nitride-based semiconductor light-emitting device 400 injected into the first semiconductor structure 408 does not flow into the un-doped or unintentionally-doped AlGaN based layer 406. The first conductivity of the first semiconductor structure 408 includes n type, and the second conductivity of the second semiconductor structure 412 includes p type.

The substrate 402 can include a sapphire substrate having a regularly or irregularly uneven surface, and the semiconductor buffer structure 404, the first un-doped or unintentionally-doped AlGaN based layer 406 and the light-emitting stack 418 are sequentially formed on the substrate 402 by epitaxial growth. The semiconductor buffer structure 404 can include an un-doped GaN 404b under the first un-doped or unintentionally-doped AlGaN based layer 406, and a layer 404a including a low-temperature growth III-nitride layer or a high-temperature growth III-nitride layer under the un-doped GaN 404b. The un-doped GaN 404b can be thicker than the un-doped layer 404a and the un-doped or unintentionally-doped AlGaN based layer 406, and the un-doped or unintentionally-doped AlGaN based layer 406 can be thinner than the un-doped layer 404a. The proportion of III element of the un-doped layer 404a can be decreased in a direction from the substrate 402 to the un-doped GaN 404b and the proportion of nitride element thereof can be increased in a direction from the substrate 402 to the un-doped GaN 404b.

A second un-doped or unintentionally-doped $Al_{x2}Ga_{1-x2}N$ 414 can be formed between the active structure 410 and the second semiconductor structure 412, and $x_2 \le 0.2$. The second un-doped or unintentionally-doped $Al_{x2}Ga_{1-x2}N$ 414 can be adjacent to a last barrier 410a of the active structure 410. The active region 410 includes alternate barriers and quantum wells, and the last barrier layer 410a is the one closet to the second semiconductor structure 412. A superlattice structure 416 can be formed between the second semiconductor structure 412 and the second un-doped or unintentionally-doped $Al_{x2}Ga_{1-x2}N$ 414, and the superlattice structure 414 can be similar to that of the seventh embodiment. The structure comprising the second un-doped or unintentionally-doped $Al_{x2}Ga_{1-x2}N$ 414 and the superlattice structure 416 is functional to prevent electrons reacted in the active region 410 overflowing to the second semiconductor structure 412.

Figure 17:
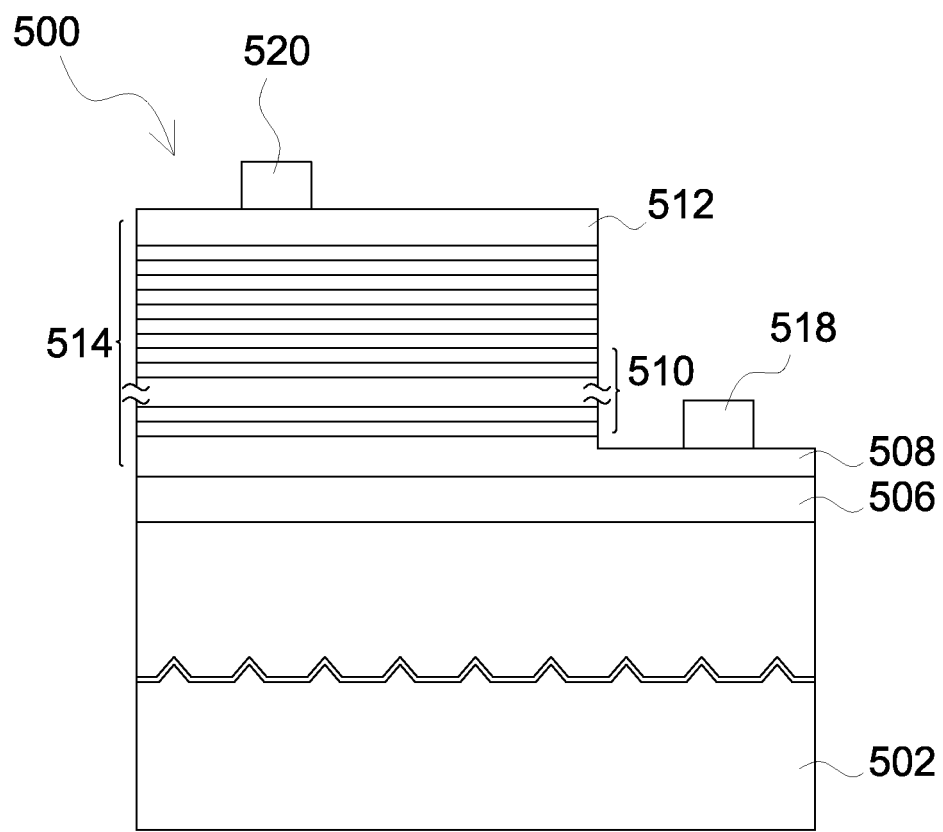
FIG. 17 illustrates a nitride-based semiconductor light-emitting device in accordance with a ninth embodiment of the present application.

Referring to FIG. 17, a nitride-based semiconductor light-emitting device in accordance with a ninth embodiment of the present application is disclosed. A nitride-based semiconductor light-emitting device 500 includes: a substrate 502; a light-emitting stack 514 formed on the substrate 502 and comprising a first semiconductor structure 508 having a first conductivity, a second semiconductor structure 512 having a second conductivity, and an active region 510 interposed the first semiconductor structure 508 and the second semiconductor structure 512; and an un-doped or unintentionally-doped AlGaN based layer 506 formed between the first semiconductor structure 508 and the substrate 502. The present embodiment can be achieved by using further process on any of the aforesaid embodiments. A portion of the first semiconductor structure 508 is exposed by removing second semiconductor structure 512 and the active region 510 thereon, and a first electrode 518 can be formed on the first semiconductor structure 508, and a second electrode 520 can be formed on the second semiconductor structure 512.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A nitride-based semiconductor light-emitting device, comprising:
   a light-emitting stack comprising a first semiconductor structure having a first conductivity, a second semiconductor structure having a second conductivity, and an active region between the first semiconductor structure and the second semiconductor structure;
   a semiconductor buffer structure formed under the first semiconductor structure; and
   an un-doped AlGaN layer formed between the first semiconductor structure and the semiconductor buffer structure,
   wherein the un-doped AlGaN layer comprises a thickness between 40 and 600 angstrom.

2. The nitride-based semiconductor light-emitting device of claim 1, wherein the un-doped AlGaN layer comprises $Al_{x1}Ga_{1-x1}N$, and $0.08 \leq x1 \leq 0.12$.

3. The nitride-based semiconductor light-emitting device of claim 1, wherein the semiconductor buffer structure comprises an un-doped GaN under the un-doped AlGaN layer.

4. The nitride-based semiconductor light-emitting device of claim 3, further comprising a substrate under the semiconductor buffer structure, wherein the semiconductor buffer structure, the un-doped AlGaN layer and the first semiconductor structure are sequentially formed on the substrate by epitaxial growth.

5. The nitride-based semiconductor light-emitting device of claim 4, wherein the substrate comprises sapphire.

6. The nitride-based semiconductor light-emitting device of claim 1, wherein the un-doped AlGaN layer directly contacts the semiconductor buffer structure.

7. A nitride-based semiconductor light-emitting device, comprising:
   a light-emitting stack comprising a first semiconductor structure having a first conductivity, a second semiconductor structure having a second conductivity, and an active region between the first semiconductor structure and the second semiconductor structure;
   a semiconductor buffer structure formed under the first semiconductor structure; and
   a first un-doped AlGaN layer formed between the first semiconductor structure and the semiconductor buffer structure; and
   a second un-doped $Al_{x2}Ga_{1-x2}N$ between the active structure and the second semiconductor structure, and $x_2 \leq 0.2$,
   wherein the active structure comprises quantum wells and barriers alternately stacked, and one last barrier closest to the second semiconductor structure compared to the barriers, and the second un-doped $Al_{x2}Ga_{1-x2}N$ is between the one last barrier and the second semiconductor structure.

8. The nitride-based semiconductor light-emitting device of claim 1, further comprising a superlattice structure formed between the first semiconductor structure and the active structure, wherein the superlattice structure comprises a first layer and a second layer and are arranged alternately, the first layer comprises $Al_{x3}Ga_{1-x3}N$ and the second layer comprises $In_{x4}Ga_{1-x4}N$, and $0.15 \leq x_3 \leq 0.2$; $0 \leq x_4 \leq 0.1$.

9. The nitride-based semiconductor light-emitting device of claim 8, wherein the first layer and the second layer are alternately arranged for six to fifty times.

10. The nitride-based semiconductor light-emitting device of claim 4, wherein the first semiconductor structure is under the active structure and adjacent to the un-doped AlGaN layer.

11. A nitride-based semiconductor light-emitting device, comprising:
    a light-emitting stack comprising a first semiconductor structure having a first conductivity, a second semiconductor structure having a second conductivity, and an active region between the first semiconductor structure and the second semiconductor structure;
    a semiconductor buffer structure formed under the first semiconductor structure;
    an un-doped AlGaN layer formed between the first semiconductor structure and the semiconductor buffer structure; and
    a substrate under the semiconductor buffer structure,
    wherein the first semiconductor structure is between the active structure and the un-doped AlGaN layer, and the semiconductor buffer structure comprises an un-doped first layer under the un-doped AlGaN layer, and an un-doped second layer under the un-doped first layer and above the substrate,
    wherein the thickness of the un-doped first layer is thicker than that of the un-doped second layer and the un-doped AlGaN based layer, and the thickness of the un-doped AlGaN based layer is thinner than that of the un-doped second layer.

12. The nitride-based semiconductor light-emitting device of claim 11, wherein the un-doped first layer, the un-doped second layer, and the un-doped AlGaN based layer are single crystalline.

13. The nitride-based semiconductor light-emitting device of claim 11, wherein the un-doped second layer comprises a III-nitride layer, the proportion of III element is decreased in a direction from the substrate to the un-doped first layer and the proportion of nitride element is increased in a direction from the substrate to the un-doped first layer.

14. A nitride-based semiconductor light-emitting device, comprising:
    a substrate;
    a semiconductor buffer structure formed above the substrate;
    a first un-doped AlGaN layer formed above the semiconductor buffer structure;
    a first semiconductor structure having a first conductivity formed above the first un-doped AlGaN layer;
    an active region formed above the first semiconductor;
    a second un-doped AlGaN layer formed above the active region;
    a superlattice structure formed on the second un-doped AlGaN layer; and
    a second semiconductor structure having a second conductivity formed on the superlattice structure.

15. The nitride-based semiconductor light-emitting device of claim 14, wherein the first un-doped AlGaN layer comprises $Al_{x1}Ga_{1-x1}N$, and $0.08 \leq x1 \leq 0.12$.

16. The nitride-based semiconductor light-emitting device of claim 14, wherein the first un-doped AlGaN layer comprises a thickness between 40 and 600 angstrom.

17. The nitride-based semiconductor light-emitting device of claim 14, wherein the semiconductor buffer structure comprises an un-doped first layer and an un-doped second layer, the un-doped second layer is between the un-doped first layer and the substrate.

* * * * *